United States Patent [19]

Hagimura et al.

[11] Patent Number: 4,988,909
[45] Date of Patent: Jan. 29, 1991

[54] PIEZOELECTRIC ELEMENT WITH GIANT ELECTROSTRICTIVE EFFECT AND CERAMIC COMPOSITION FOR PREPARING SAME

[75] Inventors: Atsushi Hagimura, Kamakura; Mutsuo Nakajima, Tokyo, both of Japan

[73] Assignee: Mitsui Toatsu Chemicals, Inc., Tokyo, Japan

[21] Appl. No.: 465,897

[22] Filed: Jan. 16, 1990

[51] Int. Cl.$^5$ .................. H01L 41/08; C04B 35/00
[52] U.S. Cl. ................................. 310/358; 252/62.9
[58] Field of Search .......................... 310/357–359, 310/311; 252/62.9

[56] References Cited

U.S. PATENT DOCUMENTS

4,333,842  6/1982  Ito et al. ................. 310/358 X
4,568,848  2/1986  Ogawa ..................... 310/358
4,918,350  4/1990  Ando et al. .............. 310/358 X

*Primary Examiner*—Mark O. Budd
*Attorney, Agent, or Firm*—Burns, Doane, Swecker & Mathis

[57] ABSTRACT

The present invention relates to a longitudinally effective piezoelectric element exhibiting a large displacement at low voltage and to a ceramic composition suitable for producing the longitudinally effective piezoelectric element.

9 Claims, 2 Drawing Sheets

PIEZOELECTRIC ELEMENT WITH GIANT ELECTROSTRICTIVE EFFECT AND CERAMIC COMPOSITION FOR PREPARING SAME

BACKGROUND OF THE INVENTION (a) Field of the Invention

The present invention relates to a longitudinally effective piezoelectric element. More particularly, it relates to a longitudinally effective piezoelectric element exhibiting a giant displacement at low voltage and to a ceramic composition suitable for producing the longitudinally effective piezoelectric element.

Such type of longitudinally effective piezoelectric element is practically applied to a wire driving element of impact dot matrix printers, a positioning element of super precision main table for use in the production of semiconductors and other various elements. It is now expected to further develop in the future for accurate positioning elements and micro driving elements.

(b) Prior Art of the Invention

Conventionally, typical actuators are motors driven by electromagnetic force, systems converting rotation of electromagnetic motors to a linear motion through combination of gears or voice coils obtained by combining electromagnetic coils with springs. These actuators are widely used in machinery for high speed continuous rotation and positioning.

Recently, the demand for new actuators has rapidly increased mainly in the field of optical precision instruments and semiconductor elements. For example, the demand is in the working of optical instruments such as lasers and cameras, in the positioning of semiconductor production equipment, and in the adjustment of optical-pass length in optics and astronomy. The required precision has already reached to a level of 1 micron or less and the requirement for precision will become increasingly severe. In order to satisfy these requirements, conventional positioning devices utilizing electromagnetic motors are too complex in construction and controlling, and voice coils have also disadvantages in output and response.

General characteristics required for a novel actuator in place of the above conventional actuators are summarized as follows.

1. Large displacement,
2. No or small hysterisis error,
3. Quick responsivility,
4. Driving ability under low energy,
5. Large output,
6. Slight influence by temperature variation,
7. Small size and light weight,
8. No deterioration during use.

Recently, attention has been rapidly focused on an electrostrictive actuator utilizing piezoelectric and/or electrostrictive properties of ceramics as a candidate for the novel actuator satisfying the above requirements.

The electrostrictive property sometimes includes, in a broad sense, a piezoelectric property in that ceramics generate strain when an electric field is applied to the ceramics. However, in a narrow sense, the electrostrictive property is defined as a property where the strain factor is proportional to the square of electric field strength. On the other hand, the piezoelectric property is defined as a property where the strain factor is proportional in a first order to electric field strength. Further, the ceramics having a piezoelectric property causes spontaneous polarization and hence exhibits a very high coercive field and polarization treatment must be carried out in order to use it for elements. The present invention defines the piezoelectric material having a coercive field in excess of 5 kV/cm as a hard material. On the other hand, the ceramics having an electrostrictive property have a coercive field of 0 kV/cm and causes no spontaneous polarization. Consequently, no polarization treatment is required. The present invention defines the ceramics as an electrostrictive material. In addition, an intermediate piezoelectric material between the hard material and the electrostrictive material, practically a piezoelectric material having a coercive field of approximately from 0 to 5 kV/cm, easily changes its direction of polarization depending upon the applied electric field. Such type of piezoelectric material has also no requirement for polarization treatment. The present invention defines such type of piezoelectric material as a soft material.

As mentioned above, the electrostrictive material is roughly classified into three groups, that is, (1) a hard material, (2) a soft material and (3) an electrostrictive material. Representative examples of electric field-strain curves of these materials are illustrated in FIGS. 1(a), 1(b) and 1(c).

Figure 1A:
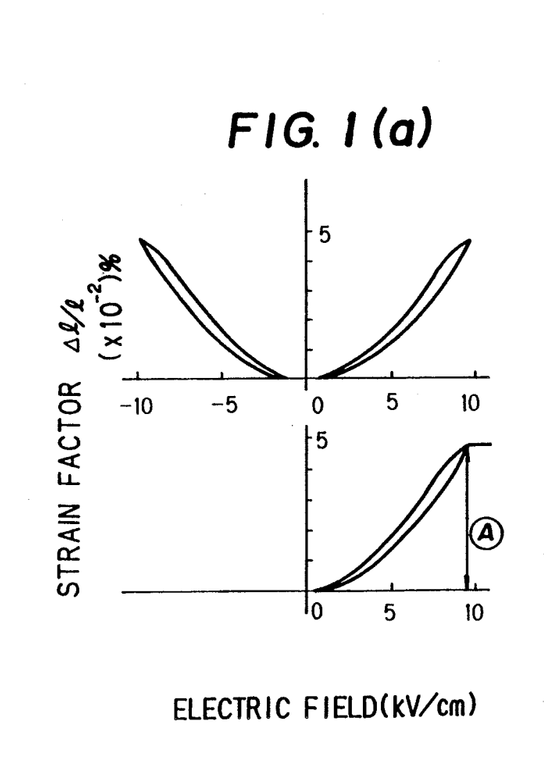
Figure 1B:
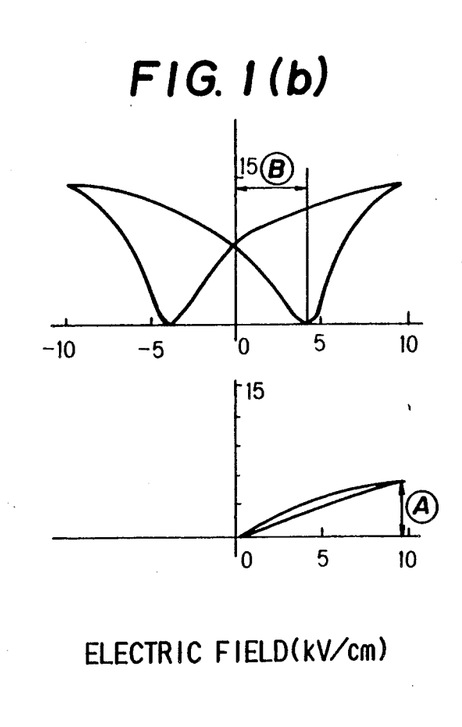

As illustrated in the electric field-strain curves of FIGS. 1(a), 1(b) and 1(c), in the cases where the electric field is alternately applied to these materials, the samples initially cause shrinkage in appearance due to their residual polarization as compared with the state thereof in the electric field level of 0 kV/cm and then lead to a rapid expansion. The coercive field of the present invention is defined as a value of the electric field where the rapid expansion starts. The strain factor is a value represented by the displacement amount ($\Delta l$) and the length ($l$) of a sample in the direction of applied electric field when an electric field of 10 kv/cm is applied to the sample. The strain factor is indicated by $\Delta l/l \times 100$ (%).

At present a generally known electrostrictive material is:

$Pb(Mg_{1/3}Nb_{2/3})O_3$ and further includes ceramics based on:

$(Pb,Ba)(Zr,Ti)O_3$ (hereinafter abbreviated as PBZT).

As to PBZT ceramics, K. M. Leung et al of HANEY WELL CO. already reported on a composition:

$Pb_{0.73}Ba_{0.27})_{0.97}Bi_{0.02}Zr_{0.70}Ti_{0.30}O_3$

[Ferroelectric, vol 27, page 41–43(1980) ].

According to the report, the composition had an electrostrictive property and a coercive field of 0 kv/cm. Even though an electric field of 10 kv/cm was applied to them, the ceramics of the above composition exhibited a strain factor of only 0.06 %. The present inventors also confirmed the same result in the below described Example 40. According to the investigation of this inventors, the dielectoric permittivity is from 5000 to 6000.

The ceramics of such composition require high voltage in order to obtain a large displacement, also have a disadvantage of a large electrical consumption due to their high dielectric permittivity during drive in high-frequency electric field and hence are quite difficult to be used for actuators. Further, the ceramics of such composition exert a marked weight loss in a sintering process. The weight loss amounts to 10 %. The weight loss is assumed to depended on lead evaporation which causes severe problems in the industrial production.

On the other hand, Japanese Patent Laid-Open Publication 60-144984(1985) discloses a ceramic composition on the basis of PBZT+Pb-Ba-Bi-W where the content of W+Bi is 1.5 atom % or less. The composition can be applied to actuators utilizing a transverse piezoelectric effect.

The transverse piezoelectric effect refers to the effect utilizing displacement in the rectangular direction to the direction of applied electric field. The effect is used, for example, for bi-morph elements etc. On the other hand, the longitudinal piezoelectric effect refers to the effect utilizing displacement parallel to the direction of applied electric field. The effect is used for multilayered piezoelectric elements etc. as illustrated in the present invention. The ceramic composition disclosed in Japanese Patent Laid-Open Publication No. 60-144984(1985) is a hard material having a coercive field of exceeding 5 kV/cm. The composition must be subjected to polarization treatment prior to use as illustrated in the examples of the publication. As illustrated in Examples 41 and 42 described below, the ceramic composition exhibits a strain factor Of only 0.08 % even in the electric field of 10 kV/cm, and cannot be employed at all for the elements exerting a large displacement.

Many patents have been applied for ceramic compositions containing PBZT and various metal dopants. Several patents have also been applied for ceramic compositions containing alkali metals and/or alkali earth metals in place of lead. Any of these compositions, however, is used for elements or filters having a high dielectric permittivity and not characterized by a large displacement.

As to the longitudinally effective electrostrictive element, a multilayered type longitudinally effective piezoelectric element is marketed from NEC Corp. According to the catalog thereof, the element has a coercive field of 6 kV/cm. The strain factor is 0.09 % at an applied electric field of 15 kV/cm and about 0.06 % at an applied electric field of 10 kv/cm. These displacements are considerably small and hence a complex displacement magnifying mechanism or a high voltage generator is required. The element still has many disadvantages to be improved.

Other longitudinally effective electrostrictive elements have also been reported in papers etc. However, any of these elements has a similar strain factor to that of the above NEC's element.

As mentioned above, the longitudinally effective piezoelectric element having a large displacement has not yet been fully developed.

SUMMARY OF THE INVENTION

One object of this invention is to provide a longitudinally effective piezoelectric element having a large strain factor, a multilayered type longitudinally effective piezoelectric element and a soft material for use in making the elements.

The present inventors have carried out an intesive investigation in order to achieve the above object. As a result, the following information has been obtained. A hard material having a coercive field of more than 5 kv/cm and an electrostrictive material having a coercive field of 0 kV/cm cannot provide an element having a large displacement. Only a soft material having a coercive field of 0 to 5 kV/cm can provide the longitudinally effective piezoelectric element having a large displacement. In order to obtain the soft material, it is also important to optimize the kind of PBZT composition and the amount of dopants. Further, the longitudinally effective piezoelectric element exhibiting a very large strain factor can be obtained by utilizing an electrostrictive ceramic composition having a coercive field of 0 to 5 kV/cm, preferably 1 to 4 kV/cm.

One aspect of this invention is a piezoelectric element exhibiting a giant displacement which essentially comprises providing an electrode on both sides of a thin plate or thin film of a ceramic composition represented by formula (I):

$$(Pb_xBa_{1-x})_aMe_b(Zr_yTi_{1-y})_cO_d \qquad (I)$$

wherein x, y, a, b and c are a value having a range of $0.70 < x < 0.80$, $0.45 \leq y \leq 0.65$, $0.85 \leq a \leq 1.15$, $0.001 \leq b \leq 0.1$ and $0.85 \leq c \leq 1.15$, respectively; d is a value determined by the Oxidized state of each element; and Me is one or more of metals selected from the group consisting of Ta, Nb, Nd, Y, Th, Bi and W, and exhibiting an electrostrictive property having a coercive field in the range of from higher than 0 kv/cm to 5 kV/cm or less.

Another aspect of this invention is a piezoelectric element exhibiting a giant displacement having a ceramic composition represented by formula (I) wherein x, y, a, b and c are a value having a range of $0.70 < x < 0.75$, $0.45 \leq y \leq 0.65$, $0.85 \leq a \leq 1.15$, $0.001 \leq b \leq 0.06$ and $0.85 \leq c \leq 1.15$, respectively; d is a value determined by the oxidized state of each element; and Me is one or more of metals selected from the group consisting of Ta, Nb, Nd, Y, Th, Bi and W.

Further aspect of this invention is a piezoelectric element exhibiting a giant displacement having a ceramic composition represented by formula (I) wherein x, y, a, b and c are a value having a range of $0.75 \leq x < 0.80$, $0.45 \leq y \leq 0.65$, $0.85 \leq a \leq 1.15$, $0.02 \leq b \leq 0.01$ and $0.85 \leq c \leq 1.15$, respectively; d is a value determined by the oxidized state of each element; and Me is one or more of metals selected from the group consisting of Ta, Nb, Nd, Y, Th, Bi and W.

Still another aspect of this invention is a multilayered piezoelectric element exhibiting a giant displacement which essentially comprises alternately stacking an electrode plate and a ceramic composition represented by formula (I) wherein x, y, a, b and c are a value having a range of $0.70 < x < 0.80$, $0.45 \leq y \leq 0.65$, $0.85 \leq a \leq 1.15$, $0.001 \leq b \leq 0.1$ and $0.85 \leq c \leq 1.15$, respectively; d is a value determined by the oxidized state of each element; and Me is one or more of metals selected from the group consisting of Ta, Nb, Nd, Y, Th, Bi and W, and exhibiting an electrostrictive property having a coercive field in the range of from higher than 0 kV/cm to 5 kV/cm or less, and further providing an external electrode.

Still further aspect of this invention is a multilayered piezoelectric element exhibiting a giant displacement having a ceramic composition represented by formula (I) wherein x, y, a, b and c are a value having a range of $0.70 < x < 0.75$, $0.45 \leq y \leq 0.65$, $0.85 \leq a \leq 1.15$, $0.001 \leq b \leq 0/06$ and $0.85 \leq c \leq 1.15$, respectively; d is a value determined by the oxidized state of each element; and Me is one or more of metals selected from the group consisting of Ta, Nb, Nd, Y, Th, Bi and W.

Another aspect of this invention is a multilayered piezoelectric element exhibiting a giant displacement having a composition represented by formula (I) wherein x, y, a, b and c are a value having a range of $0.75 \leq x < 0.80$, $0.45 \leq y \leq 0.65$, $0.85 \leq a \leq 1.15$, $0.02 \leq b \leq 0.1$ and $0.85 \leq c \leq 1.15$, respectively; d is a value determined by the oxidized state of each element; and Me is one or more of metals selected from the group consisting of Ta, Nb, Nd, Y, Th, Bi and W.

Further aspect of this invention is a piezoelectric ceramic composition exhibiting a giant piezoelectric effect represented by formula (I) wherein x, y, a, b and c are a value having a range of $0.70 < x < 0.80$, $0.45 \leq y \leq 0.65$, $0.85 \leq a \leq 1.15$, $0.001 \leq b \leq 0.1$ and $0.85 \leq c \leq 1.15$, respectively; d is a value determined by the oxidized state of each element; and Me is one or more of metals selected from the group consisting of Ta, Nb, Nd, Y, Th, Bi and W.

Still another aspect of this invention is a piezoelectric ceramic composition exhibiting a giant piezoelectric effect represented by formula (I) wherein x, y, a, b and c are a value having a range of $0.70 < x < 0.75$, $0.45 \leq y \leq 0.65$, $0.85 \leq a \leq 1.15$, $0.001 \leq b \leq 0.06$ and $0.85 \leq c \leq 1.15$, respectively; d is a value determined by the oxidized state Of each element; and Me is one or more of metals selected from the group consisting of Ta, Nb, Nd, Y, Th, Bi and W.

Still further aspect of this invention is a piezoelectric ceramic composition exhibiting a giant piezoelectric effect represented by formula ( ) wherein x, y, a, b and c are a value having a range of $0.75 \leq x < 0.8$, $0.45 \leq y \leq 0.65$, $0.85 \leq a < 1.15$, $0.02 \leq b \leq 0.1$ and $0.85 \leq c \leq 1.15$, respectively; d is a value determined by the oxidized state of each element; and Me is one or more of metals selected from the group consisting of Ta, Nb, Nd, Y, Th, Bi and W.

BRIEF DESCRIPTION OF THE DRAWINGS

FIG. 1(a), FIG. 1(b) and FIG. 1(c) are electric field-strain curves of an electrostrictive material, a hard material and a soft material, respectively.

In FIGS. 1(a), 1(b) and 1(c), A indicates a displacement amount $\Delta l/l$ at a coercive field of 10 kV/cm, and B indicates a coercive field.

In FIG. 2, 1 indicates a ceramic composition, 2 indicates an external electrode and 3 indicates an internal electrode and 4 indicates a lead wire.

FIG. 3(b) is a drawing of sections vertically cut on surface (A) and surface (B) in FIG. 3(a). In the drawing, 8 indicates an external electrode, 9 indicates an insulation layer, 10 indicates an internal electrode, 11 indicates a lead wire and 12 indicates a ceramic composition.

DETAILED DESCRIPTION OF THE INVENTION

In the practice of this invention, the PBZT skeleton composition is important. In the above formula (I), x, y, a and c are a value in the range of $0.70 < x < 0.80$, $0.45 \leq y \leq 0.65$, $0.85 \leq a \leq 1.15$ and $0.85 \leq c \leq 1.15$, respectively. When the value of x is smaller than 0.70, the value of y is larger than 0.65, or the value of a is smaller than 0.85 or larger than 1.15, or when the value of c is smaller than 0.85 or larger than 1.15, the composition is an electrostrictive material and unsuitable for use because the coercive field becomes 0 kV/cm and strain also lowers. On the other hand, in the cases where the value of x is larger than 0.80 or the value of y is smaller than 0.45, the composition is a hard material and the coercive field exceeds 5 kv/cm. The composition requires polarization treatment, gives a small strain and hence is also unsuitable for use.

In the present invention, one or more of elements selected from the group consisting of Th, Ta, Nb, Nd, Y, Bi and W must be added to the PBET skeleton composition as a dopant, that is, Me in the above formula (I).

Patents which comprise addition of $Al_2O_3$ have been applied.

However, addition of elements other than those found by the present inventors has no effect on the magnification of strain. As illustrated in Examples 43 and 44 described below, metals such as aluminum and iron give adverse effects because these metals remarkably increase thier coercive field and decrease strain.

When the values of x, y, a and c in the PBZT skelton composition of the above formula (I) are in the range of $0.70 < x < 0.80$, $0.45 \leq y \leq 0.65$, $0.85 \leq a \leq 1.15$ and $0.85 \leq c \leq 1.15$, respectively, the amount of dopants is in the range of $0.001 \leq b \leq 0.10$. When the value of b exceeds 0.10, the ceramic composition becomes an electrostrictive material and is unsuitable for use because the coercive field is 0 kV/cm and strain decreases remarkably. On the other hand, in the case where the value of b is smaller than 0.001, the ceramic composition exhibits a hard piezoelectric property having a coercive field of exceeding 5 kV/cm and is also unsuitable for use due to its decrease in strain.

A preferred range of b is $0.001 \leq b \leq 0.06$ when the ranges of x, y, a and c are $0.70 < x < 0.75$, $0.45 \leq y \leq 0.65$, $0.85 \leq a \leq 1.15$ and $0.85 \leq c \leq 1.15$, respectively. Another preferred range of b is $0.02 \leq b \leq 0.10$ when the ranges of x, y, a and c are $0.75 \leq x < 0.80$, $0.45 \leq y \leq 0.65$, $0.85 \leq a \leq 1.15$ and $0.85 \leq c \leq 1.15$, respectively.

Figures 2, 3A, 3B, 4:
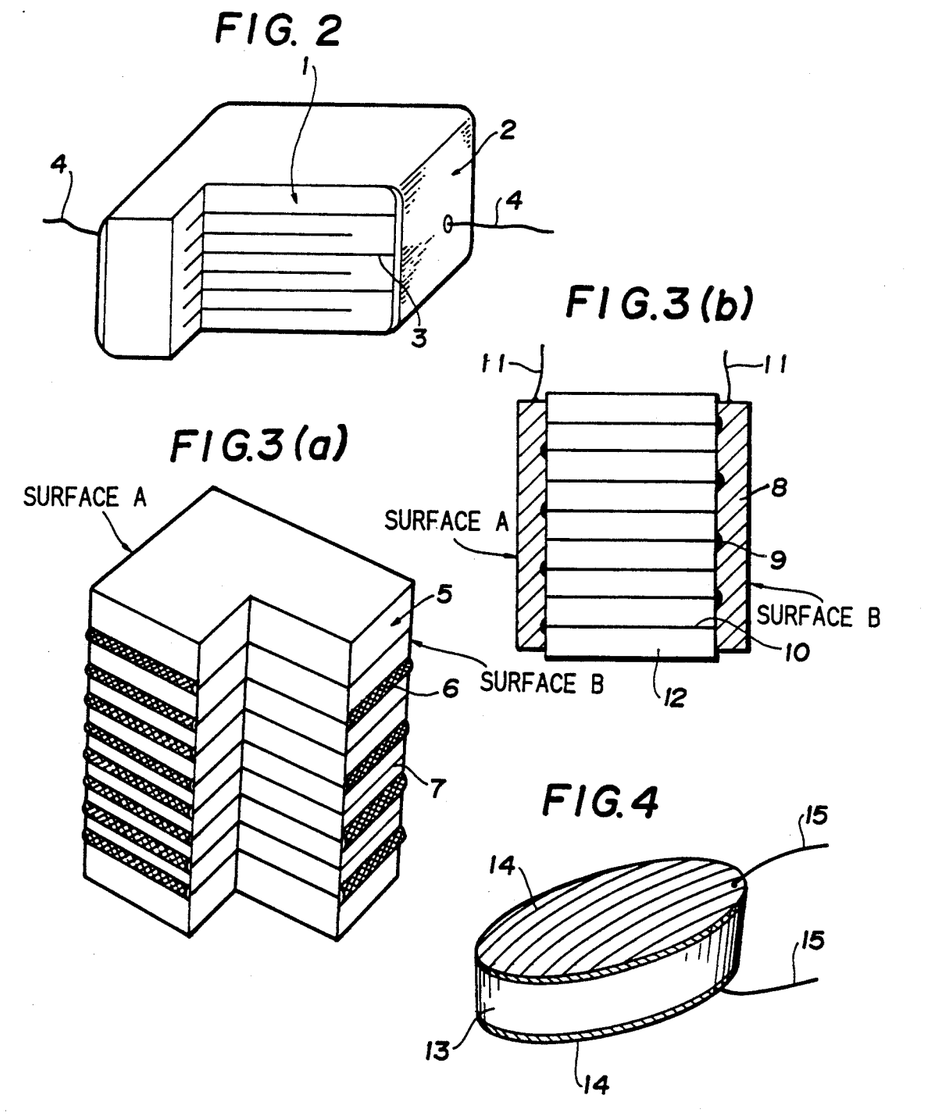
FIG. 2 is a multilayered type longitudinally effective piezoelectric element having an internal electrode plate which covers a portion of the element section.
FIG. 3(a) is a multilayered type longitudinally effective piezoelectric element having an internal electrode plate which covers the whole section of the element. In the Figure, an external electrode and a lead wire are omitted for the purpose of simplicity. In the Figure, 5 indicates a ceramic composition, 6 indicates an insulation layer 7 and indicates an internal electrode. Example 38 has 51 sheets of ceramic composition 5 in the laminated layer.
FIG. 3(b) is a multilayered type longitudinally effective piezoelectric element having an internal electrode plate which covers the whole section of the element.
FIG. 4 is a single plate of a longitudinally effective peizoelectric element. In the drawing, 13 indicates a ceramic composition and 14 indicates an electrode and 15 indicates a pair of lead wire.

The structure of a multilayered type longitudinally effective piezoelectric element exhibiting a giant displacement of this invention is illustrated in FIGS. 3(a) and 3(b). Films or thin plates of ceramic composition obtained by this invention and internal electrode plates are alternately multilayered. The internal electrode plates are wired so as to have a plus or minus pole alternately every layer and equipped with lead wires and external connection terminals in order to couple with external circuits. The size of the element is arbitrary and specified by the system where the element is integrated. The thickness of film or thin plate of the ceramic composition is also arbitrary. However, a thinner film or plate is preferred for preparing an element exhibiting a large displacement at low voltage. Hence, the thickness of the ceramic composition is usually 2000 μm or less, preferably 500 μm or less and more preferably 200 μm or less. On the other hand, when the ceramic composition becomes too thin, unfavorable effects are observed, for example, cracks are liable to generate during operation and poor insulation occurs between electrodes. Accordingly, the thickness of the ceramic composition is preferably 1 μm or more, more preferably 3 μm or more and most preferably 6 μm or more.

Materials of the internal electrode plates are usually gold, silver, palladium, platinum, copper, nickel etc. and alloys of these metals. As illustrated in FIG. 2, the internal electrode plate may cover merely a portion of the section of the element. In this case, however, stress is concentrated around the edge of the electrode plate during operation and sometimes causes destruction. Consequently, it is preferred to cover the whole section of the element with the internal electrode plate.

The multilayer numbers of the internal electrode plate and the film or thin plate Of the above ceramic composition is arbitrary. The multilayer number may be one, that is, a single plate. Various ways of multilayering are admitted. Ceramic compositions having different kinds of thickness may be multilayered and those containing different components may also be multilayered. The latter case, in particular, is advantageous in that properties other than displacement of the element, for example, dielectric permittivity, tan δ and temperature dependency, etc. can be varied to meet the requirements of the system where the element is integrated.

The element of this invention is sometimes sealed in order to protect a jointing portion of the internal electrode plate and the lead wire or the external connection terminal. The preferred sealing material is a flexible resin. Sealing is conducted on the four surfaces rectangular to the internal electrode panel. Two surfaces parallel to the internal electrode panel are usually not sealed.

Raw materials used for the preparation of the ceramic composition of this invention are compounds of Pb, Ba, Ta, Nb, Nd, Y, Th, Bi, W, Zr and Ti. Any compounds may be used so long as the compound converts to an oxide by heating. Exemplary compounds of these metals suitable for use include, for example, an oxide, hydroxide, nitrate, sulfate, phosphate, oxynitrate, oxysulfate, oxychloride, halogenides such as chloride, fluoride, bromide and iodide, carbonate, and salts of organic carboxylic acids such as oxalic acid, acetic acid and citric acid.

These raw materials are measured or weighed and then are mixed at a pre-determined ratio.

As a mixing apparatus, a ball mill is desirable, but it may be other apparatus which is commonly used to mix powders, for example, a homo-mixer, an attrition mill, or a vibrating mixer. The period of time necessary for mixing raw materials depends on the mixing apparatus and properties of raw materials, but it is generally within the range of 2 to 20 hours. The period of time is, of course, not limited to said particular value.

The powders of these raw materials are calcined. The calcination temperature is within the range of 600° to 1,000° C., preferably 800° to 900° C. The calcination is preferably carried out in the air for 1 to 10 hours. The pre-determined strain factor can not be obtained when the calcination temperature is under 600° C. On the other hand, if the calcination temperature is not lower than 1000° C., grains become too large. Further, even if the calcination is made over 10 hours, there is no effect to be noted. The calcination over 10 hours is not desirable from the economical view point. This calcination can be performed in a nitrogen gas, an oxygen gas, or an argon gas as well as the air.

The calcined powders are fine-ground in the next process. As a fine-grinding apparatus, for example, a ball mill, a vibrating mill and an attrition mill are used, whereby the raw materials are fine-ground to the order of 80 mesh. A purpose of such fine-grinding is to eliminate a bad influence on the grain growth caused by the calcination process.

Any process may be used for preparing the element of this invention from the calcined powders so long as the process satisfies the above constitution. Processing with a doctor blade is usually carried out.

In this process, the calcined powders are mixed with a suitable binder and solvent. A film is prepared from the resulting mixture by using a doctor blade. A metal electrode is printed on the film, multilayered and then thermo-pressed Organic components such as binder are removed from the molded article and sintering is carried out at 1100° C. to 1350° C., preferably at 1200° C. to 1320° C. A multilayered product of the internal electrode plate and the ceramic composition is thus obtained Finally, end portions of the internal electrode plates which are emerged on the side faces of the elements are fitted with external connectors such as lead wires, and the side faces are sealed.

The above process is advantageous in producing a large amount of elements at relatively low cost. As an alternative process, the ceramic composition may be previously sintered, cut into a desired thickness and then the resultant thin plate of the ceramic composition may be bonded with an electrode plate by using adhesive. The thin plate may be used as such for a single plate. In a further process, the ceramic composition is deposited by CVD or PVD on the surface of an electrode plate and then another electrode palte is bonded on the deposited surface by using adhesive Thereafter the ceramic composition is deposited again by CVD or PVD on the surface of the newly bonded electrode plate. The process may be repeated to prepare the stacked element.

The present invention will hereinafter be illustrated further in detail by way of examples.

EXAMPLE 1

In a ball mill, 26.06 g of PbO, 8.523 g of $BaCO_3$, 11.178 g of $ZrO_2$, 5.93 g of $TiO_2$, and 0.736 g of $Bi_2O_3$ were mixed for 10 hours. The mixture was calcined in the air at 850° C. for 2 hours.

Thereafter the calcined material was pulverized by the wet process at a slurry concentration of 30% by weight. The thus-obtained powder was dried and pressed into a disc with a pressure of 2 $t/cm^2$. The disc was sintered at 1250° C. for 5 hours. The sintered disc had a density of 7 $g/cm^3$ to 7.2 $g/cm^3$. The sintered disc was cut into a thickness of 0.3 mm and silver electrodes were baked on both surfaces of the disc.

An electric field was applied to both ends of the thus-obtained sample. Strain factor at 10 kV/cm and coercive field were measured by using a potentiometer. The results are illustrated in Table 1.

EXAMPLES AND COMPARATIVE EXAMPLES 2-45

The same procedure as conducted in Example 1 was carried out except the following procedure.

Pb, Ba, Zr, Ti and dopants were charged in amounts so as to obtain compositions illustrated in Table 1. The starting materials of Pb, Ba, Zr and Ti were the same as used in Example 1. The starting materials of the dopants were $Ta_2O_5$, $Nb_2O_5$, $ThO_2$, $Y_2O_3$, $Bi_2O_3$, $WO_3$ and $Nd_2O_3$, respectively.

The results are illustrated in Table 1.

In Table 1, the symbol* indicates comparative examples.

EXAMPLE 46

In a ball mill, 271 g of PbO, 88 g of $BaCO_3$, 110 g of $ZrO_2$, 58 g of $TiO_2$ and 7.3 g of $Ta_2O_5$ were mixed for 10 hours. The mixture was calcined in the air at 850° C. for 2 hours.

The calcined material was charged again into the ball mill, 50 g of water was added, and the mixture was pulverized for 18 hours and dried.

In the ball mill, 100 g of the pulverized powder, 10 g of polyvinyl butyral, 2 g of butyl phthalyl glycol and 20 g of xylene were mixed until the powder was uniformly dispersed in the solution and polyvinyl butyral was completely dissolved. The thus-obtained slurry had a viscosity of 6000 cps at 25° C. The slurry was cast into a film with a doctor blade. The thus-obtained ceramic film had a thickness of 120μm.

A platinum paste for use in the internal electrode was printed on one side of the film and cut into a rectangular thin plate being 30 mm in width and 50 mm in length. Subsequently, 50 sheets of thin plate thus obtained were multilayered so as to alternately stack the ceramic film and the printed electrode paste. The printed electrode paste on the surface of the laminate was covered with a non-printed film and the laminate was hot-pressed at 80° C.

The hot-pressed laminate was placed in an air stream and gradually heated from room temperature to 450° C. over about 3 days to carry out degreasing. The degreased laminate was sintered at 1250° C. for 5 hours. One layer of the ceramic film in the sintered laminate had a thickness of about 100 μm. One layer of the electrode in the sintered laminate had a thickness of 3μm.

The sintered laminate was cut in the direction perpendicular to the ceramic film while maintaining the multilayer number. A small piece having dimensions of 5 mm×5 mm was obtained.

As conceptionally illustrated in FIGS. 3(a) and 3(b), glass insulation layers were installed so that adjacent electrodes mutually constituted oppositely charged poles. Further, silver paste was equipped as an external electrode and a lead wire was connected to obtian a multilayered type longitudinally effective piezoelectric element. Strain factor and coercive field of the multilayered element were measured by the same method as in Example 1.

The results were a strain factor of 0.12 % and a coercive field of 1.4 kv/cm.

As clearly illustrated in the above examples, the longitudinally effective piezoelectric element of the present invention exhibits a strain factor of 0.10 % or more in the electric field of 10 kV/cm. The maximum strain factor is 0.13 %, which value is epoch-making in view of the fact that commercially available elements have a value of about 0.06 %. Consequently, a remarkably broad field of application is expected for the piezoelectric element of the present invention.

TABLE 1

| Example | Additive | x | y | a | b | c | Strain factor × $10^{-2}$ (%) | Coercive field (kV/cm) |
|---|---|---|---|---|---|---|---|---|
| 1 | Ta | 0.79 | 0.55 | 1.00 | 0.07 | 0.9125 | 12.5 | 1.5 |
| 2 | " | 0.77 | " | " | 0.05 | 0.9375 | 12.8 | 1.8 |
| 3 | " | 0.75 | " | " | 0.04 | 0.9500 | 13.1 | 1.9 |
| 4 | " | 0.73 | " | " | 0.02 | 0.9750 | 13.8 | 1.3 |
| 5 | " | 0.705 | " | " | 0.005 | 0.9938 | 12.6 | 1.0 |
| 6 | " | 0.80 | 0.45 | " | 0.1 | 0.8750 | 12.1 | 1.5 |
| 7 | " | 0.77 | " | " | 0.08 | 0.9000 | 13.1 | 1.7 |
| 8 | " | 0.75 | " | " | 0.06 | 0.9250 | 13.6 | 1.9 |
| 9 | " | 0.73 | " | " | 0.03 | 0.9625 | 13.8 | 1.3 |
| 10 | " | 0.705 | " | " | 0.02 | 0.9750 | 12.5 | 0.8 |
| 11 | " | 0.80 | 0.65 | " | 0.05 | 0.9375 | 12.6 | 1.6 |
| 12 | " | 0.77 | " | " | 0.03 | 0.9625 | 12.7 | 1.5 |
| 13 | " | 0.75 | " | " | 0.02 | 0.9750 | 12.8 | 1.4 |
| 14 | " | 0.73 | " | " | 0.01 | 0.9875 | 13.5 | 1.3 |
| 15 | " | 0.705 | " | " | 0.001 | 0.9988 | 12.4 | 0.8 |
| *16 | " | 0.68 | 0.55 | " | " | 0.9994 | 4.0 | 0.0 |
| *17 | " | " | 0.45 | " | " | " | 6.0 | " |
| *18 | " | " | 0.65 | " | " | " | 4.0 | " |
| *19 | " | 0.80 | 0.70 | " | 0.02 | 0.975 | " | " |
| *20 | " | 0.75 | " | " | " | " | 5.0 | " |
| *21 | " | 0.70 | " | " | " | " | 6.0 | " |
| *22 | " | 0.80 | 0.40 | " | 0.06 | 0.925 | " | " |
| *23 | " | 0.75 | " | " | " | " | 4.6 | 6.3 |
| *24 | " | 0.72 | " | " | " | " | 4.3 | 6.5 |
| *25 | " | 0.83 | 0.45 | " | 0.10 | 0.875 | 3.6 | 6.0 |
| *26 | " | 0.83 | 0.55 | 1.00 | 0.10 | 0.875 | 4.2 | 6.5 |
| *27 | " | " | 0.65 | " | " | " | 3.3 | 6.2 |
| 28 | Nb | 0.73 | 0.55 | 1.00 | 0.02 | 0.975 | 13.7 | 2.0 |
| 29 | Th | " | " | 0.96 | " | 1.00 | 13.4 | 1.9 |
| 30 | Y | " | " | 0.97 | " | " | 12.8 | 1.6 |
| 31 | Bi | " | " | " | " | " | 13.8 | 1.9 |
| 32 | W | " | " | 1.00 | " | 0.97 | 13.2 | 1.6 |
| 33 | Nd | " | " | 0.97 | " | 1.00 | 13.8 | 1.7 |

TABLE 1-continued

| Example | Additive | x | y | a | b | c | Strain factor × $10^{-2}$ (%) | Coercive field (kV/cm) |
|---|---|---|---|---|---|---|---|---|
| *34 | Ta | " | " | 1.00 | 0.0008 | 0.99 | 4.0 | 7.0 |
| *35 | " | " | " | " | 0.12 | 0.85 | 2.0 | 0.0 |
| 36 | " | " | " | " | 0.07 | 0.9125 | 10.0 | 0.3 |
| 37 | " | 0.78 | " | " | 0.018 | 0.9775 | 10.4 | 3.2 |
| *38 | " | 0.73 | " | " | 0.0005 | 0.9970 | 6.0 | 7.2 |
| *39 | " | 0.78 | " | " | 0.12 | 0.8500 | 4.0 | 0.0 |
| *40 | Bi | 0.73 | 0.70 | 0.97 | 0.02 | 1.00 | 6.0 | " |
| *41 | Bi + W | 0.75 | 0.55 | 1.00 | 0.015 | " | 7.0 | 6.3 |
| *42 | " | 0.78 | 0.54 | " | " | " | 7.6 | 6.4 |
| *43 | Al | 0.73 | 0.55 | " | 0.02 | 0.99 | 7.5 | 6.3 |
| *44 | Fe | " | 0.55 | " | " | " | 2.0 | 6.7 |
| *45 | — | " | 0.65 | " | — | 1.00 | 7.8 | 6.8 |

Note:
*Comparative Example

What is claimed is:

1. A piezoelectric element exhibiting a giant displacement which essentially comprises providing an electrode on both sides of a thin plate or thin film of a ceramic composition represented by the formula:

$$(Pb_xBa_{1-x})_aMe_b(Zr_yTi_{1-y})_cO_d$$

wherein x, y, a, b and c are a value having a range of $0.70 < x < 0.80$, $0.45 \leq y \leq 0.65$, $0.85 \leq a \leq 1.15$, $0.001 \leq b \leq 0.1$ and $0.85 \leq c \leq 1.15$, respectively: d is a value determined by the oxidized state of each element: and Me is one or more of metals selected from the group consisting of Ta, Nb, Nd, Y, Th, Bi and W, and exhibiting an electrostrictive property having a coercive field in the range of from higher than 0 kV/cm to 5 kV/cm or less.

2. A piezoelectric element exhibiting a giant displacement of claim 1 wherein the ceramic composition is represented by the formula:

$$(Pb_xBa_{1-x})_aMe_b(Zr_yTi_{1-y})_cO_d$$

wherein x, y, a, b and c are a value having a range of $0.70 < x < 0.75$, $0.45 \leq y \leq 0.65$, $0.85 \leq a \leq 1.15$, $0.001 \leq b \leq 0.06$ and $0.85 \leq c \leq 1.15$, respectively; d is a value determined by the oxidized state of each element: and Me is one or more of metals selected from the group consisting of Ta, Nb, Nd, Y, Th, Bi and W.

3. A piezoelectric element exhibiting a giant displacement of claim 1 wherein the ceramic compositions is represented by the formula:

$$(Pb_xBa_{1-x})_aMe_b(Zr_yTi_{1-y})_cO_d$$

wherein x, y, a, b and c are
 a value having a range of $0.75 \leq x < 0.80$, $0.45 \leq y \leq 0.65$, $0.85 \leq a \leq 1.15$, $0.02 \leq b \leq 0.1$ and $0.85 \leq c \leq 1.15$, respectively; d is a value determined by the oxidized state of each element; and Me is one or more of metals selected from the group consisting of Ta, Nb, Nd, Y, Th, Bi and W.

4. A multilayered piezoelectric element exhibiting a giant displacement which essentially comprises alternately stacking an electrode plate and a ceramic composition represented by the formula:

$$(Pb_xBa_{1-x})_aMe_b(Zr_yTi_{1-y})_cO_d$$

wherein x, y, a, b and c are a value having a range of $0.70 < x < 0.80$, $0.45 \leq y \leq 0.65$, $0.85 \leq a \leq 1.15$, $0.001 \leq b \leq 0.1$ and $0.85 \leq c \leq 1.15$, respectively; d is a value determined by the oxidized state of each element: and Me is one or more of metals selected from the group consisting of Ta, Nb, Nd, Y, Th, Bi and W, and exhibiting an electrostrictive property having a coercive field in the range of from higher than 0 kv/cm to 5 kV/cm or less, and further providing an external electrode.

5. A multilayered piezoelectric element exhibiting a giant displacement of claim 4 wherein the ceramic composition is represented by the formula:

$$(Pb_xBa_{1-x})_aMe_b(Zr_yTi_{1-y})_cO_d$$

wherein x, y, a, b and c are a value having a range of $0.70 < x < 0.75$, $0.45 \leq y \leq 0.65$, $0.85 \leq a \leq 1.15$, $0.001 \leq b \leq 0.06$ and $0.85 \leq c \leq 1.15$, respectively; d is a value determined by the oxidized state of each element; and Me is one or more of metals selected from the group consisting of Ta, Nb, Nd, Y, Th, Bi and W.

6. A multilayered piezoelectric element exhibiting a giant displacement of claim 4 wherein the ceramic composition is represented by the formula:

$$(Pb_xBa_{1-x})_aMe_b(Zr_yTi_{1-y})_cO_d$$

wherein x, y, a, b and c are a value having a range of $0.75 \leq x < 0.80$, $0.45 \leq y \leq 0.65$, $0.85 \leq a \leq 1.15$, $0.02 \leq b \leq 0.1$ and $0.85 \leq c \leq 1.15$, respectively: d is a value determined by the oxidized state of each element; and Me is one or more of metals selected from the group consisting of Ta, Nb, Nd, Y, Th, Bi and W.

7. A piezoelectric ceramic composition exhibiting a giant piezoelectric effect represented by the formula:

$$(Pb_xBa_{1-x})_aMe_b(Zr_yTi_{1-y})_cO_d$$

wherein x, y, a, b and c are a value having a range of $0.70 < x < 0.80$, $0.45 \leq y \leq 0.65$, $0.85 \leq a 1.15$, $0.001 \leq 0.1$ and $0.85 \leq C \leq 1.15$, respectively; d is a value determined by the oxidized state of each element; and Me is one or more of metals selected from the group consisting of Ta, Nb, Nd, Y, Th, Bi and W.

8. A piezoelectric ceramic composition exhibiting a giant piezoelectric effect of claim 7 wherein the ceramic composition is represented by the formula:

$$(Pb_xBa_{1-x})_aMe_b(Zr_yTi_{1-y})_cO_d$$

wherein x, y, a, b and c are a value having a range of $0.70 < x < 0.75$, $0.45 \leq y \leq 0.65$, $0.85 \leq a \leq 1.15$, $0.001 \leq b \leq 0.06$ and $0.85 \leq c \leq 1.15$, respectively; d is value determined by the oxidized state of each element; and Me is one or more of metals selected from the group consisting of Ta, Nb, Nd, Y, Th, Bi and W.

9. A piezoelectric ceramic composition exhibiting a giant piezoelectric effect of claim 7 wherein the ceramic composition is represented by the formula:

$$(Pb_xBa_{1-x})_a Me_b(Zr_y Ti_{1-y})_c O_d$$

wherein x, y, a, b and c are a value having a range of $0.75 \leq x < 0.80$, $0.45 \leq y \leq 0.65$, $0.85 \leq a \leq 1.15$, $0.02 \leq b \leq 0.1$ and $0.85 \leq 1.15$, respectively; d is a value determined by the oxidized state of each element; and Me is one or more of metals selected from the group consisting of Ta, Nb, Nd, Y, Th, Bi and W.

* * * * *

UNITED STATES PATENT AND TRADEMARK OFFICE
CERTIFICATE OF CORRECTION

PATENT NO. : 4,988,909

DATED : January 29, 1991

INVENTOR(S) : Hagimura et al.

It is certified that error appears in the above-identified patent and that said Letters Patent is hereby corrected as shown below:

On the title page of the patent, below the filing date, please list the Foreign Priority Documents as follows:

--[30]             Foreign Application Priority Data

Jan. 20, 1989 [JP]    Japan................................01-009677
    Feb. 27, 1989 [JP]    Japan................................01-042928
    Jun.  2, 1989 [JP]    Japan................................01-139255 --.

Signed and Sealed this

Twenty-fifth Day of August, 1992

Attest:

DOUGLAS B. COMER

*Attesting Officer*       *Acting Commissioner of Patents and Trademarks*